(12) United States Patent
Bruin

(10) Patent No.: US 7,999,617 B2
(45) Date of Patent: Aug. 16, 2011

(54) AMPLIFIER CIRCUIT

(75) Inventor: Paul Bruin, Nijmegen (NL)

(73) Assignee: NXP B.V., Eindhoven (NL)

( * ) Notice: Subject to any disclaimer, the term of this patent is extended or adjusted under 35 U.S.C. 154(b) by 29 days.

(21) Appl. No.: 12/161,099

(22) PCT Filed: Jan. 17, 2007

(86) PCT No.: PCT/IB2007/050154
§ 371 (c)(1),
(2), (4) Date: May 12, 2010

(87) PCT Pub. No.: WO2007/083271
PCT Pub. Date: Jul. 26, 2007

(65) Prior Publication Data
US 2010/0231301 A1   Sep. 16, 2010

(30) Foreign Application Priority Data

Jan. 18, 2006 (EP) .................... 06100521

(51) Int. Cl.
*H03F 3/45* (2006.01)
(52) U.S. Cl. ...................... 330/257; 330/253
(58) Field of Classification Search ................. 330/253, 330/257
See application file for complete search history.

(56) References Cited

U.S. PATENT DOCUMENTS

| | | | |
|---|---|---|---|
| 6,741,130 B2 * | 5/2004 | Wey et al. | 330/253 |
| 6,771,126 B2 * | 8/2004 | Blankenship et al. | 330/257 |
| 7,576,610 B2 * | 8/2009 | Dalena | 330/257 |
| 2002/0060607 A1 | 5/2002 | Forejt | |
| 2003/0038678 A1 | 2/2003 | Dessard et al. | |

FOREIGN PATENT DOCUMENTS

EP   0776087 A   5/1997

OTHER PUBLICATIONS

Vincence V C et al; "Low-Voltage Class AB Operational Amplifier"; Integrated Circuits and Systems Design, 2001, 14th Symposium on. Sep. 10-15, 2001; Piscataway, NJ, USA, IEEE, pp. 207-211.

Shouli Yan et al; "A Programmable Rail-To-Rail Constant-GM Input Structure for LV Amplifier"; Circuits and Systems, 2000. Proceedings. ISCAS 2002 Geneva; The 2000 IEEE International Symposium on May 28-31, 2000, Piscataway, NJ, USA; IEEE, vol. 5, May 28, 2000, pp. 645-648.

Loikkanen M et al; "Four-Stage 1.5V Class AB Power Amplifier"; Electrotechnical Conference, 2004. MELECON 2004. Proceedings of the 12th IEEE Mediterranean, Dubrovnik, Croatia, May 12-15, 2004; Piscataway, NJ, USA, IEEE, May 12, 2004; pp. 87-90, vol. 1.

De Langen K-J et al; "Low-Voltage Power-Efficient Operational Amplifier Design Techniques—an Overview"; Proceedings of the IEEE 2003 Custom Integrated Circuits Conference. (CICC 2003), San Jose, CA, Sep. 21-24, 2003; IEEE Custom Integrated Circuits Conference, CICC, New York, NY: IEEE, US, vol. Conf. 25, pp. 677-684.

(Continued)

*Primary Examiner* — Khanh V Nguyen

(57) ABSTRACT

An amplifier circuit, comprising a differential input stage (M1, M2), two cross-coupled current mirrors (M3, M4; M5, M6) coupled to respective outputs of the differential input stage (M1, M2), and a minimum selector circuit (M11, M12, M13, M14) coupled to outputs of the current mirrors.

7 Claims, 2 Drawing Sheets

OTHER PUBLICATIONS

De Langen K-J et al; "Compact Low-Voltage Power-Efficient Operational Amplifier Cells for VLSI", IEEE Journal of Solid-State Circuits, vol. 33, No. 10, Oct. 1998, pp. 1482-1896.

Van Dongen R et al; "A 1.5 V Class AB CMOS Buffer Amplifier for Driving Low-Resistance Loads", IEEE Journal of Solid-State Circuits, vol. 30, No. 12, Dec. 1995, pp. 1333-1338.

Monticelli D.M.; "A Quad CMOS Single-Supply OP AMP With Rail-To-Rail Output Swing", IEEE Journal of Solid-State Circuits, vol. SC-21, No. 6, Dec. 1986, pp. 1026-1034.

Pardoen M.D. et al; "A Rail-To-Rail Input/Output CMOS Power Amplifier", IEEE Journal of Solid-State Circuits, vol. 25, No. 2, Apr. 1990, pp. 501-504.

Stockstad T et al; "A 0.9 V 0.5 µA Rail-To-Rail CMOS Operational Amplifier", IEEE Journal of Solid-State Circuits, vol. 37, No. 3, Mar. 2002, pp. 286-292.

Vincence V.C. et al; "A Low-Voltage CMOS Class-AB Operational Amplifier", IEEE International Symposium on Circuits and Systems 2002, vol. 3, May 26-29, 2002, p. III-603-III-606.

Op 'T Eynde F.N.L. et al; "A CMOS Large-Swing Low-Distortion Three-Stage Class AB Power Amplifier", IEEE Journal of Solid-State Circuits, vol. 25, No. 1, Feb. 1990, pp. 265-273.

Botma J.H. et al; "A Low-Voltage CMOS OP AMP With Rail-To-Rail Constant-GM Input Stage and a Class AB Rail-To-Rail Output Stage", IEEE International Symposium on Circuits and Systems 1993, May 3-6, 1993, pp. 1314-1317.

Huijsing J.H. et al; "Low-Power Low-Voltage VLSI Operational Amplifier Cells", IEEE Transactions on Circuits and Systems-I: Fundamental Theory of Applications, vol. 42, No. 11, Nov. 1995, pp. 841-852.

Huijsing J.H. et al; "Low-Voltage Operational Amplifier With Rail-To-Rail Input and Output Ranges", IEEE Journal of Solid-State Circuits, vol. SC-20, No. 6, Dec. 1985, pp. 1144-1150.

\* cited by examiner

AMPLIFIER CIRCUIT

FIELD OF THE INVENTION

The invention relates to an amplifier circuit.

BACKGROUND OF THE INVENTION

To combine good performance with low quiescent current, many amplifier circuits are realized with a class-AB output stage. Furthermore, it is desired to have a second amplifier stage with high gain, to obtain low distortion. High gain is typically realized by using a common source type of circuit, or common emitter in case of bipolar transistors. In a compact, two-stage amplifier, this means that class-AB behavior is wanted in a common source type of circuit. The combination of common source output transistors and class-AB behavior can be realized by using one of the feed-forward circuits as presented in references [1], [2], [3], [4], [5], [6], and [10] listed below.

Also feedback circuits can be used which typically control the quiescent current more accurately and can give more symmetric behavior, which is good for distortion performance. Examples of these are presented in references [1], [2], [7], [8], [9], [10], and [11]. These circuits make use of a minimum selector, which compares the minimum current in the output stage transistors with a reference current. A feedback loop then ensures that the minimum current will stay at the reference level, thus ensuring that none of the output transistors will switch off completely. The feedback loop allows for accurate control of the quiescent and minimum currents in the output stage.

The solution presented in references [1] and [2] uses the same type of minimum selector as some embodiments of the current invention, but it needs an extra stage for class-AB current control, in which the minimum current in the output stage transistors is compared to a reference current and the result is converted to a differential signal that is fed back to the output stage transistor.

The solutions presented in references [8], [9], and [10] use other types of minimum selectors, but they again need many extra transistors to compare the minimum current with the reference current and then converting the result into a differential signal that can be fed back to the output transistors.

In reference [11] not the minimum current is controlled but the product of the two currents in the output transistors is kept constant. This also ensures that none of the output transistors will be switched off completely.

The solution presented in reference [7] again uses an extra stage to convey the currents from the minimum selector to the output transistors.

REFERENCES

[1] K. J. de Langen, J. H. Huijsing, "Low-Voltage Power-Efficient Operational Amplifier Design Techniques—An Overview", IEEE Custom integrated circuits conference, 2003, pp. 677-684.

[2] K. J. de Langen, J. H. Huijsing, "Compact Low-Voltage Power-Efficient Operational Amplifier Cells for VLSI", IEEE Journal of solid-state circuits, vol. 33, no. 10, October 1998, pp. 1482-1496.

[3] R. van Dongen, V. Rikkink, "A 1.5 V Class AB CMOS Buffer Amplifier for Driving Low-Resistance Loads", IEEE Journal of solid-state circuits, vol. 30, no. 12, December 1995, pp. 1333-1338.

[4] D. M. Monticelli, "A Quad CMOS Single-Supply Op Amp with Rail-to-Rail Output Swing", IEEE Journal of solid-state circuits, vol. SC-21, no. 6, December 1986, pp. 1026-1034.

[5] M. D. Pardoen, M. G. Degrauwe, "A Rail-to-Rail Input/Output CMOS Power Amplifier", IEEE Journal of solid-state circuits, vol. 25, no. 2, April 1990, pp. 501-504.

[6] T. Stockstad, H. Yoshizawa, "A 0.9 V 0.5 µA Rail-to-Rail CMOS Operational Amplifier", IEEE Journal of solid-state circuits, vol. 37, no. 3, March 2002, pp. 286-292.

[7] V. C. Vincence et al., "A Low-Voltage CMOS Class-AB Operational Amplifier", IEEE International Symposium on Circuits and Systems 2002, Vol. 3, 26-29 May 2002, p. III-603-III-606.

[8] F. N. L. op 't Eynde et al., "A CMOS Large-Swing Low-Distortion Three-Stage Class AB Power Amplifier", IEEE Journal of solid-state circuits, vol. 25, no. 1 February 1990, pp. 265-273.

[9] J. H. Botma et al., "A low-voltage CMOS Op Amp with rail-to-rail constant-$g_m$ input stage and a class AB rail-to-rail output stage", IEEE International Symposium on Circuits and Systems 1993, 3-6 May 1993, pp. 1314-1317.

[10] J. H. Huijsing et al., "Low-Power Low-Voltage VLSI Operational Amplifier Cells", IEEE Transactions on circuits and systems-1: Fundamental theory of applications, vol. 42, no. 11 November 1995, pp. 841-852.

[11] J. H. Huijsing, D. Linebacher, "Low-Voltage Operational Amplifier with Rail-to-Rail Input and Output Ranges", IEEE Journal of solid-state circuits, vol. SC-20, no. 6, December 1985, pp. 1144-1150.

OBJECT AND SUMMARY OF THE INVENTION

It is, inter alia, an object of the invention to provide an improved amplifier circuit. To this end, the invention provides an amplifier circuit as defined in claim 1. Advantageous embodiments are defined in the dependent claims.

A primary aspect of the invention provides an amplifier circuit that comprises a differential input stage, two cross-coupled current mirrors coupled to respective outputs of the differential input stage, and a minimum selector circuit coupled to outputs of the current mirrors.

An advantageous embodiment of the invention does not need an extra intermediate amplifier stage, connected to its minimum selector, to realize the class-AB behavior. In this way circuit area and also supply current can be saved.

These and other aspects of the invention will be apparent from and elucidated with reference to the embodiments described hereinafter.

DESCRIPTION OF EMBODIMENTS

Figure 1:
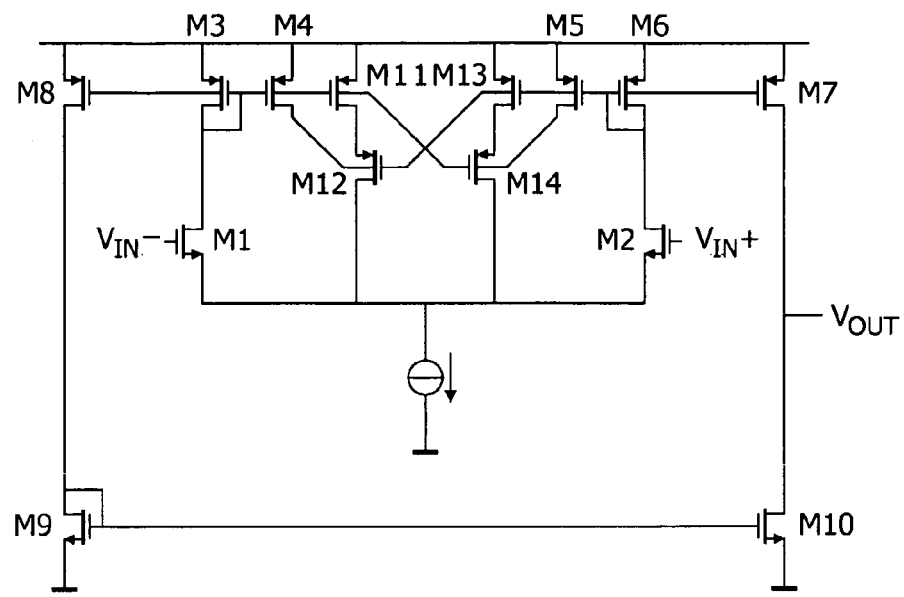
FIG. 1 shows a first embodiment of an amplifier circuit in accordance with the invention.

In the embodiment of FIG. 1, two cross-coupled current mirrors M3, M4 and M5, M6 are placed on top of a differential input stage M1 and M2 that receives a differential input voltage $V_{IN}+$, $V_{IN}-$. These two current mirrors pose a low impedance for common mode signals from the input stage (the bias current) and a high impedance for differential currents (the signal current). These differential currents will go to the gates of the common source PMOS transistors M7 and M8, which form a second differential stage. The bias current in transistors M7 and M8 is well controlled and is a scaled copy of the bias currents in the current mirrors M3, M4 and M5, M6. The scaling can be done by scaling of the dimensions of the PMOS transistors. The differential output current of transistors M7 and M8 is transformed to a single ended current by current mirror M9, M10. An output voltage $V_{OUT}$ is available at the drain of transistor M10.

To control the minimum current in the current mirror transistors M9 and M10, a simple minimum selector is added. This minimum selector basically has two MOS transistors M11 and M12 in series, of which the one that has the least drive on the gate, will determine the current. A second series connection of MOS transistors M13 and M14 is added to get symmetrical behavior. If the current in the minimum selector is less than the intended value, more current will run through transistors M1 and M2, and thus through transistors M3, ... M6, and eventually in the output stage. In this way the current in the output stage is accurately controlled.

Figure 2:
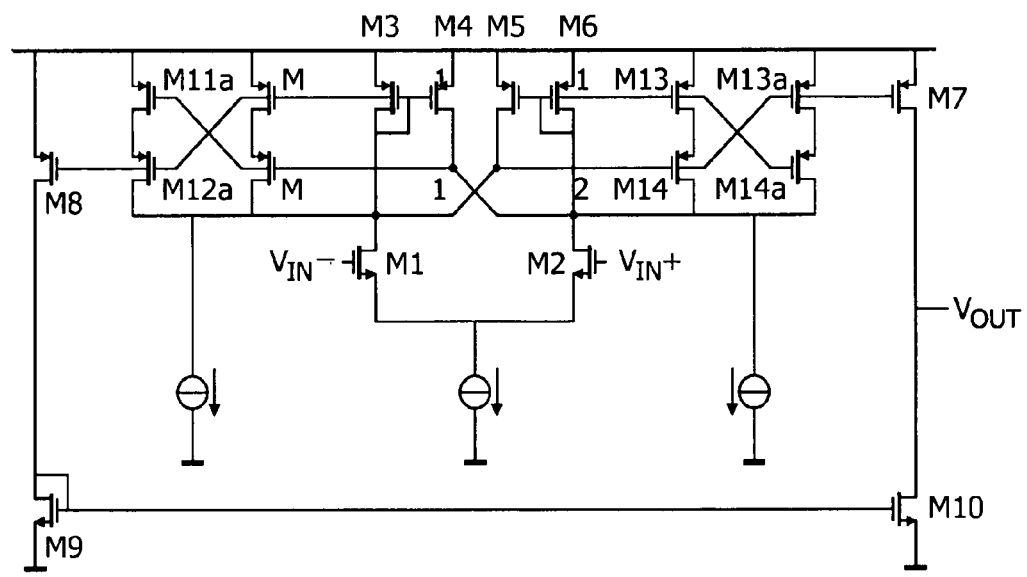
FIG. 2 shows an embodiment with constant tail current for the input stage.

In comparison with the embodiment of FIG. 1, the embodiment of FIG. 2 comprises a first minimum selector M11, M12, M11a, M12a, and a second minimum selector M13, M14, M13a, M14a to ensure that the minimum current is no longer influencing the tail current of the differential pair, whereby distortion is reduced.

Figure 3:
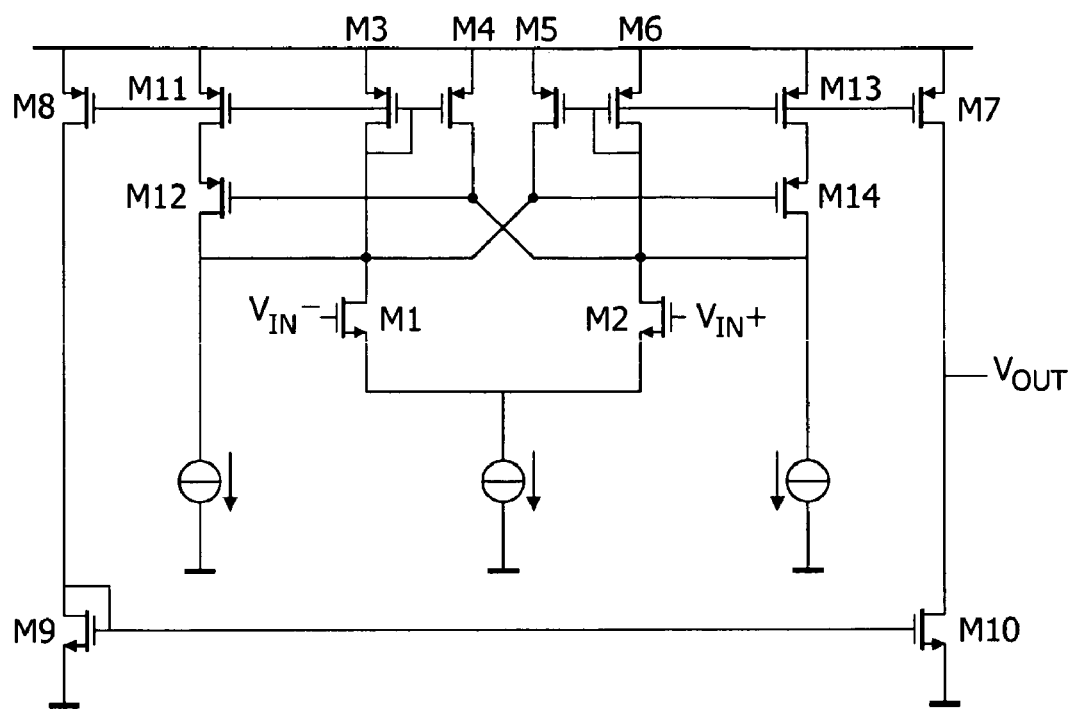
FIG. 3 shows an embodiment with constant tail current for the input stage and asymmetrical minimum selectors.

A second alternative is shown in FIG. 3, where a first asymmetrical minimum selector M11, M12, and a second asymmetrical minimum selector M13, M14 have been used. This results in common-mode to differential conversion, decreasing the differential input impedance of the PMOS current mirror stage. This means the loop gain of the circuit reduces, however also the complexity reduces with respect to the circuit in FIG. 2.

Advantageous embodiments of the invention provide a very compact circuit realizing an amplifier circuit with a class-AB common source output stage. Prior art class-AB output stages typically consist of quite complex circuits, resulting in large chip area. A practical embodiment of this invention combines two cross-coupled current mirrors with a simple MOS minimum selector, to obtain a very compact two stage amplifier, that can be biased very easily from one current source only. The circuit can be used in any circuit where a high loop gain and a class-AB behavior are desired. Examples of this are current to voltage conversion in A/D converters, audio circuits, and buffers for reference voltages. The circuit may be used in a reference buffer in an MP3 player IC, to load and unload a reference capacitor. To achieve the required charge and discharge times a substantial current is needed. Furthermore a high loop gain is required to achieve high accuracy of the reference voltage.

It should be noted that the above-mentioned embodiments illustrate rather than limit the invention, and that those skilled in the art will be able to design many alternative embodiments without departing from the scope of the appended claims. For example, instead of the types of current mirrors show, e.g. twin mirrors, cascodes or Wilson mirrors could be used. It is possible to implement the invention by replacing all NMOS transistors by PMOS transistors and reverse. The input stage and transistors M9, M10 may be bipolar transistors instead of MOS transistors.

In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The mere fact that certain measures are recited in mutually different dependent claims does not indicate that a combination of these measures cannot be used to advantage.

The invention claimed is:

1. An amplifier circuit, comprising:
a differential input stage that includes an output;
two cross-coupled current mirrors coupled to respective outputs of the differential input stage;
a second differential stage providing current in response to the output of the differential input stage; and
a minimum selector circuit coupled to outputs of the current mirrors including a series connection of two transistors that are configured and arranged to maintain a minimum current in an output stage.

2. An amplifier as claimed in claim 1, wherein said minimum selector circuit comprises a symmetrical minimum selector.

3. An amplifier as claimed in claim 1, wherein said minimum selector circuit comprises two minimum selectors.

4. An amplifier as claimed in claim 3, wherein said minimum selectors are asymmetrical.

5. The amplifier of claim 1, wherein the minimum selector circuit further includes two additional transistors arranged in a series connection, a gate of the first additional transistor coupled to the gate of the second transistor of the two transistors and a gate of the second additional transistor coupled to the gate of the first transistor of the two transistors.

6. The amplifier of claim 1, wherein the differential input stage includes two input stage transistors and wherein the amplifier further includes a current source coupled to the source of each of the two input stage transistors.

7. The amplifier of claim 6, further including an additional current source coupled to a drain of a transistor of the two transistors of the minimum selector circuit.

* * * * *